(12) United States Patent
McElheny et al.

(10) Patent No.: US 8,130,538 B2
(45) Date of Patent: Mar. 6, 2012

(54) NON-VOLATILE MEMORY CIRCUIT INCLUDING VOLTAGE DIVIDER WITH PHASE CHANGE MEMORY DEVICES

(75) Inventors: Peter J. McElheny, Morgan Hill, CA (US); Richard G. Smolen, Redwood City, CA (US); John C. Costello, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 461 days.

(21) Appl. No.: 12/354,121

(22) Filed: Jan. 15, 2009

(65) Prior Publication Data

US 2010/0177560 A1 Jul. 15, 2010

(51) Int. Cl.
*G11C 11/00* (2006.01)
(52) U.S. Cl. ............ 365/163; 365/148; 365/63; 327/38; 327/39
(58) Field of Classification Search .................. 365/163, 365/148, 63; 327/38, 39
See application file for complete search history.

(56) References Cited

U.S. PATENT DOCUMENTS

| RE36,952 E | 11/2000 | Zagar et al. |
| 2004/0125643 A1 | 7/2004 | Kang et al. |
| 2006/0028247 A1* | 2/2006 | Hara et al. .................... 326/104 |
| 2007/0002618 A1 | 1/2007 | Schoenauer et al. |
| 2007/0146012 A1 | 6/2007 | Murphy et al. |
| 2010/0148821 A1* | 6/2010 | Yu et al. ......................... 326/41 |

OTHER PUBLICATIONS

International Search Report and Written Opinion for Application No. PCT/US2010/020327, dated Mar. 31, 2010, pp. 1-13.

\* cited by examiner

*Primary Examiner* — Vu Le
*Assistant Examiner* — Han Yang
(74) *Attorney, Agent, or Firm* — Mauriel Kapouytian & Treffert LLP; Ararat Kapouytian (57) ABSTRACT

A memory circuit including a voltage divider with a first phase change memory (PCM) device and a second PCM device coupled to the first PCM device is described. In one embodiment, the first PCM device is in a set resistance state and the second PCM device is in a reset resistance state. Also, in one embodiment, the voltage divider further includes a first switch coupled to the first PCM device and a second switch coupled to the first switch and the second PCM device. In one embodiment, the memory circuit further includes a half latch coupled to the voltage divider and a cascade transistor coupled to the half latch and the voltage divider.

25 Claims, 4 Drawing Sheets

NON-VOLATILE MEMORY CIRCUIT INCLUDING VOLTAGE DIVIDER WITH PHASE CHANGE MEMORY DEVICES

BACKGROUND

The present invention relates to memory circuits.

Programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names), are well-known integrated circuits (ICs) that provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Placing new data into the configuration elements programs or reprograms the PLD's logic functions and associated routing pathways. Configuration elements that are field programmable are often implemented as random access memory (RAM) cells, which in PLDs are sometimes referred to a "configuration RAM" (CRAM)). CRAMs are generally implemented as a 6-transistor static RAM (6T-SRAM). Thus, CRAMs generally refer to SRAM. As such, the term CRAM is herein used to refer to configuration memory implemented as SRAM.

CRAMs suffer from a number of disadvantages. First, they are susceptible to soft errors (which are sometimes referred to as "one-off errors"). The soft error rate (SER) increases as component device sizes are reduced or as voltages applied to the component devices (e.g., Vcc) are reduced. As a result, soft errors limit lowering the size of the component devices used in the CRAM or the voltages applied to its component devices. Consequently, larger component devices and higher applied voltages are used. Moreover, at times, layouts that add more capacitance to devices are used, which makes the CRAM less susceptible to soft errors. This complicates the layout process. Second, as CRAMs are volatile memories, each time a PLD is powered on, configuration data must be loaded and stored in the CRAM. This causes undesirable delays in readying the PLD.

One way to correct soft errors in CRAM is to reload the configuration data. This, however, requires interrupting the operation of the PLD. Another technique to correct soft errors is to use multiple redundancy (e.g., triple redundancy). This, in turn, requires using a larger CRAM block. Additionally, both of these methods require use of error detection methods.

SUMMARY

In one aspect, an embodiment of the present invention provides a memory circuit including a voltage divider with a first phase change memory (PCM) device and a second PCM device coupled to the first PCM device. In one embodiment, the first PCM device is in a set resistance state and the second PCM device is in a reset resistance state. Also, in one embodiment, the voltage divider further includes a first switch coupled to the first PCM device and a second switch coupled to the first switch and the second PCM device. In one embodiment, the memory circuit further includes a half latch coupled to the voltage divider and a cascade transistor coupled to the half latch and the voltage divider.

As an embodiment of the memory circuit of the present invention uses PCM devices to store data, it is less susceptible than a CRAM to soft errors. Moreover, an embodiment of the memory circuit of the present invention is non-volatile, and decreases configuration time. Both external flash memory and internal block memory have slow configuration times compared to the proposed distributed configuration PCM (CPCM) memory cell.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
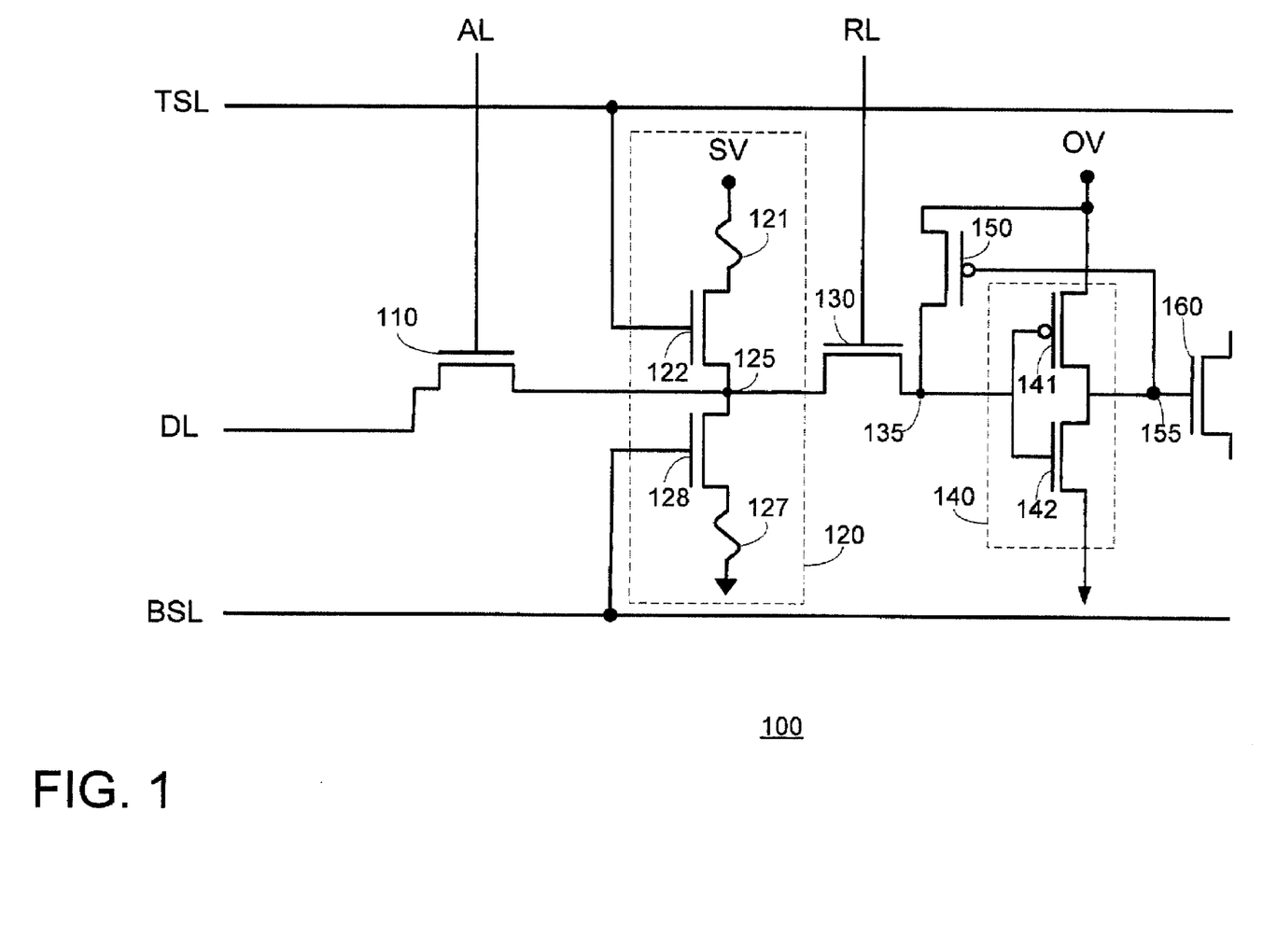
FIG. 1 is a block diagram of one embodiment of a memory circuit of the present invention.

FIG. 1 is a block diagram of one embodiment of a memory circuit of the present invention. In FIG. 1, memory circuit 100 includes address line switch 110, voltage divider 120, read line switch 130, half latch 140, cascade transistor 150 (the combination of half latch 140 plus cascade transistor 150 may herein be referred to as a sense amplifier), and pass gate 160. Pass gate 160 can be used, for example, to configure a look up table (LUT) or to connect two metal interconnect lines used for global routing. It is to be noted that memory circuit 100 may be defined to exclude pass gate 160. Alternatively, memory circuit 100 may be defined to exclude address line switch 110 and pass gate 160. It is also to be noted that a memory circuit, such as memory circuit 100, is at times referred to as a non-volatile memory cell.

Voltage divider 120 includes PCM device 121, switches 122 and 128, and PCM device 127 coupled in series as shown in FIG. 1. PCM device 121 and switch 122 may herein be referred to as top PCM device 121 and top switch 122, respectively. Similarly, PCM device 127 and switch 128 may herein be referred to as bottom PCM device 127 and bottom switch 128, respectively.

In one embodiment, half latch 140 is a complementary metal oxide semiconductor (CMOS) inverter, which includes p-channel metal oxide semiconductor (PMOS) transistor 141 and n-channel metal oxide semiconductor (NMOS) transistor 142.

In one embodiment, address line switch 110, read line switch 130, switches 122 and 128, and pass gate 160 are all NMOS transistors, whereas cascade transistor 150 is a PMOS transistor. In one embodiment, switches 122 and 128 are NMOS transistors of the same size.

In one embodiment, the address line (AL) signal and the read line (RL) signal control the states of address line switch 110 and read line switch 130, respectively. The data line (DL) signal is the signal input into address line switch 110. It is to be noted that both a DL voltage and a DL current are input into address line switch 110. The top select line (TSL) signal and the bottom select line (BSL) signal control the states of top switch 122 and bottom switch 128, respectively. The sense voltage (SV) signal is applied to one terminal of top PCM device 121, as shown in FIG. 1. The overdrive voltage (OV) signal is applied to half latch 140 and cascade transistor 150, as shown in FIG. 1. OV is defined as the maximum reliable voltage applied across the gate oxide for a given technology. The OV is a sum of Vcc plus Vod, where Vod depends on the oxide thickness of the transistor 160 and represents the voltage needed in addition to Vcc to allow transistor 160 to pass the entire voltage signal Vcc from drain to source without a Vt drop (where Vt represents the threshold voltage of the transistor). In other words, OV=Vcc+Vod.

In one embodiment, each of PCM device 121 and PCM device 127 is a PCM device with a pillar cell structure. Also in one embodiment, each of PCM device 121 and PCM device 127 is a PCM device that includes a first layer and a second layer connected to the first layer. In one embodiment, the first layer includes a layer of titanium nitride (TiN). Such a first layer may herein be referred to as a TiN layer. The second layer includes a layer of chalcogenide alloy of germanium (Ge), antimony (Sb) and tellurium (Te), collectively referred to as GST, and nitrogen (N). Such a second layer may herein be referred to as a GST:N layer. In one embodiment, the TiN layer of PCM device 121 is coupled to a metal contact that is coupled to SV and the GST:N layer of PCM device 121 is coupled to a contact made of tungsten (W), which may herein be referred to as a W plug. This W plug is in turn coupled to the drain of the top switch 122. Also, in one embodiment, the TiN layer of PCM device 127 is coupled to a metal contact that is coupled to ground, and the GST:N layer of PCM device 127 is coupled to a W plug. This W plug is in turn coupled to the drain of the bottom switch 128.

It is to be noted that the pillar cell structure requires less area than some other cell structures. In another embodiment, the PCM devices may have a horizontal cell structure, which may also be referred to as a linear cell structure.

In one embodiment, the PCM devices are easily integrated with CMOS processes for the CMOS devices of the memory circuit.

In one embodiment, PCM devices 121 and 127 are constructed of the same materials and have the same characteristics and layout. In another embodiment, PCM devices 121 and 127 may be constructed of different materials, may have different characteristics and may have different layouts.

In one embodiment, PCM devices 121 and 127 can achieve data retention for 10 years at a temperature of 125 degrees Celsius (° C.). This meets or exceeds the data retention of 10 years at a temperature of 85 to 125° C. required by some ICs. Also, in one embodiment, PCM devices 121 and 127 can achieve cycling endurances of above $10^7$ cycles. This is well above the $10^2$ to $10^3$ cycles required in some ICs.

A PCM device may be in a SET state (i.e., a low resistance state) or a RESET state (i.e., a high resistance state). Some of the key parameters of a PCM device include the hold voltage Vh, the threshold voltage Vth, the SET state resistance, and the RESET state resistance. In one embodiment, the initial or virgin state of a PCM device is the RESET state. This may be achieved through low temperature deposition of the PCM device material and allows for avoiding large crow-bar currents when configuring ICs such as PLDs. The Vth of a PCM device, among other things, depends on the material composition of the PCM device, the thickness of the material, and the cell structure of the PCM device.

In one embodiment, the SET state resistance is approximately 3 orders of magnitude less than the RESET state resistance. In another embodiment, the SET state resistance is approximately 6 orders of magnitude less than the RESET state resistance. It is to be noted that embodiments of the present invention are not limited to the above examples of the ratios of the SET state and RESET state resistances.

In one embodiment, applying a device voltage to the PCM device above its Vth while limiting the current applied to the device to approximately 0.2 to 0.7 milliamperes (mA) causes the PCM device to transition from the RESET state to the SET state. Also, in one embodiment, applying a device voltage to the PCM device greater than Vh and less than Vth while applying a current above 0.7 mA causes the PCM device to transition from the SET state to the RESET state. It is to be noted that, in one embodiment, when transitioning from the SET state to the RESET state, the current applied to the PCM device is cut off quickly. This allows for keeping the PCM device material in the amorphous state. Failing to quickly cut off the current may cause some crystallization of the PCM device material which would decrease the resistance of the PCM device. In one embodiment, the current pulses applied to the PCM device to set or reset the PCM device are short pulses in the order of 10 nanoseconds (ns). Thus, in one embodiment, the programming speed for the PCM devices is on the order of 10 ns. In one embodiment, the current pulse period is approximately 50 ns for placing the device in the SET state and 20 ns for placing the device in the RESET state. Also, in one embodiment, the period of the AL signal is approximately 100 ns.

In one embodiment of memory circuit 100, the RESET state resistance is in the range of 1 megaohms (MΩ) to 1 gigaohms (GΩ) and Vth is well below OV for a given technology node. In one embodiment, Vcc is approximately 1.2 volts (V), OV is approximately 1.55 V, Vh is approximately 0.5 V and Vth is approximately 1.2 V. As can be seen from the above, in one embodiment, Vth is on the order of Vcc.

In one embodiment, the read current (Iread), i.e., the current through voltage divider 120 is limited by SV and the PCM devices (more specifically by the PCM device in the RESET state). Also, in one embodiment, Iread can be limited by using a low gate bias (at or above Vt) for top switch 122 and bottom switch 128. It is to be noted that, in one embodiment, memory circuits with lower Iread may be more suitable for use with larger ICs.

In one embodiment where Vth is well below OV, Iread is approximately 50 nanoamperes (nA) per memory circuit for a RESET state resistance of approximately 10 MΩ, SV of approximately 0.5 V, and Iser of approximately 50 microamperes (μA), where Iser represents the current that memory circuit 100 (more specifically PCM 127 and transistor 128 of memory circuit 100) can overcome in the event of a soft error. In such a case, the total static cell current for $1 \times 10^6$ memory cells is approximately 50 mA (50 nA×$1 \times 10^6$). In another embodiment where Vth is well below OV, for a RESET state resistance of approximately 100 MΩ, SV of approximately 0.5 V, and Iser of approximately 5 μA, Iread is approximately 5 nA per memory circuit. In one embodiment, memory circuit 100 does not require a fast read such as that required by flash memory.

Figure 2:
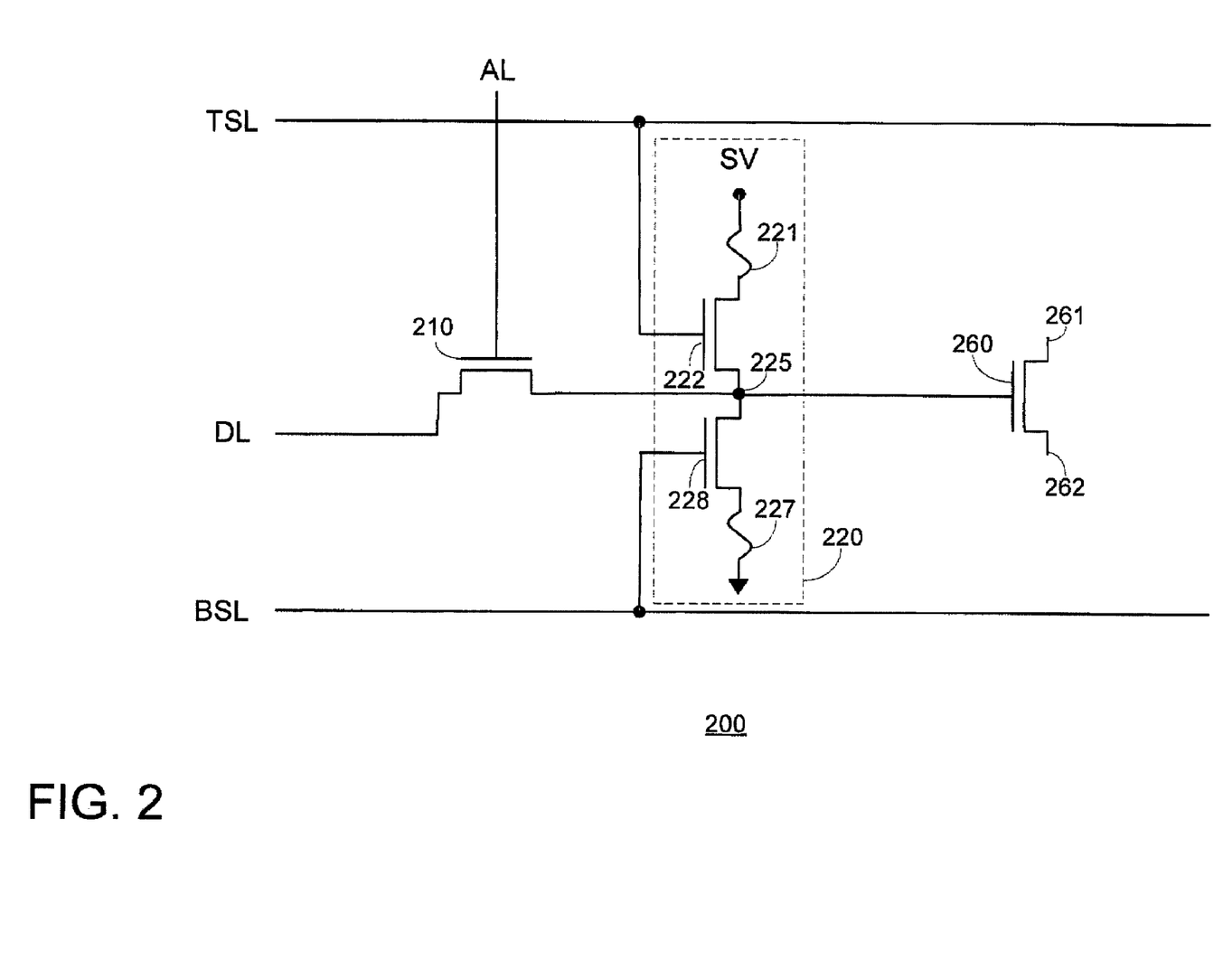
FIG. 2 is a detailed diagram of another embodiment of a memory circuit of the present invention.
Figure 3A:
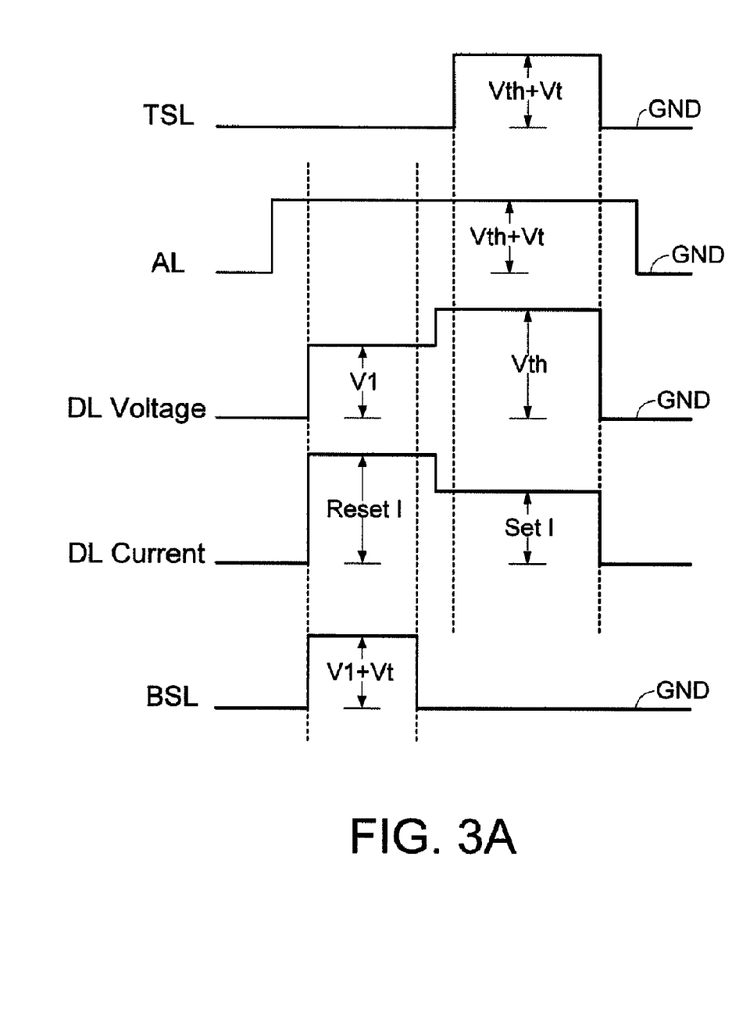
FIGS. 3A and 3B are exemplary timing diagrams for programming the phase change memory devices in the memory circuits of FIGS. 1 and 2.
Figure 3B:
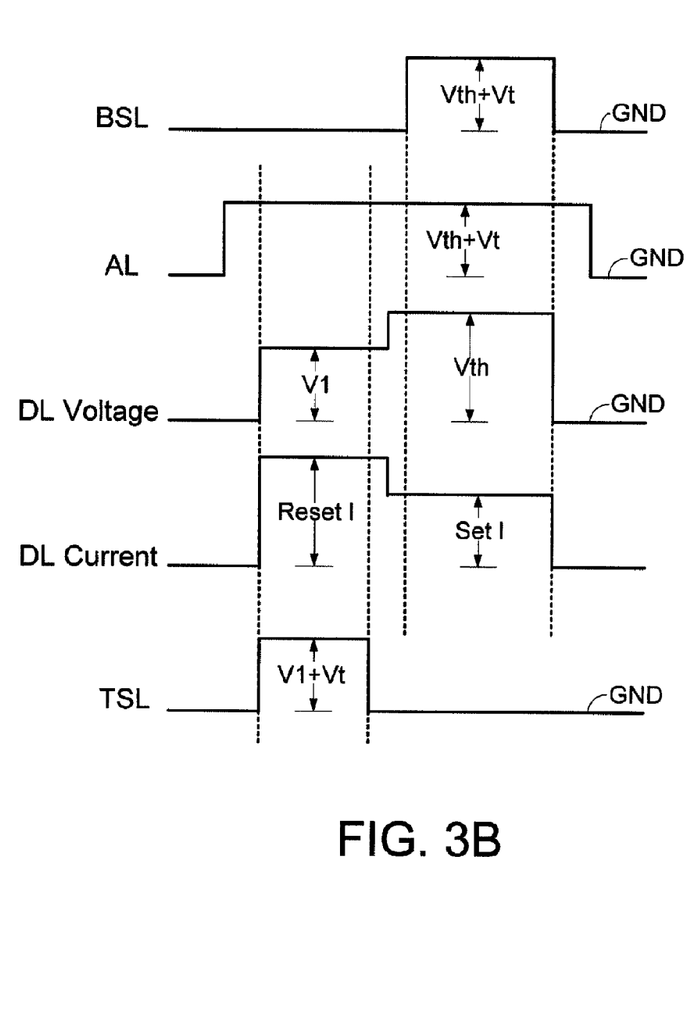

FIGS. 3A and 3B are exemplary timing diagrams for programming the PCM devices in the memory circuits of FIGS. 1 and 2. FIG. 3A is an exemplary timing diagram for programming the top PCM device (in FIGS. 1 and 2) to a SET state and the bottom PCM device (in FIGS. 1 and 2) to a RESET state. On the other hand, FIG. 3B is an exemplary timing diagram for programming the top PCM device (in FIGS. 1 and 2) to a RESET state and the bottom PCM device (in FIGS. 1 and 2) to a SET state. The operation of memory circuit 100 is described herein in conjunction with FIGS. 3A and 3B and Table 1 below which shows exemplary values for various signals in FIG. 1 during programming of PCM devices 121 and 127 and during sleep, read, and normal operation modes.

TABLE 1

|  | DL | AL | TSL | BSL | RL | SV | OV |
|---|---|---|---|---|---|---|---|
| Set Top | ≧Vth I source | ≧Vth + Vt | ≧Vth + Vt | GND | GND | GND | GND |
| Reset Bottom | V1 | ≧V1 + Vt | GND | ≧V1 + Vt | GND | GND | GND |
| Reset Top | V1 | ≧V1 + Vt | ≧V1 + Vt | GND | GND | GND | GND |
| Set Bottom | ≧Vth I source | ≧Vth + Vt | GND | ≧Vth + Vt | GND | GND | GND |
| Sleep | X | GND | Vcc | GND | <Vh + Vt | <Vh | <Vh |
| Read | X | GND | Vcc | Vcc | <Vh + Vt | <Vh | <Vh |
| Norm OP | X | GND | Vcc | Vcc | <Vh + Vt | <Vh | Vcc + Vod |

It is to be noted that, in Table 1 above, Vh<V1<Vth. It is also to be noted that, in Table 1, during normal operation mode, OV=Vcc+Vod. Moreover, in one embodiment, Vth is the minimum requirement for the DL voltage (i.e., in one embodiment, to set the PCM, the DL voltage has to be greater than Vth). Additionally, GND denotes ground, V1 denotes the DL voltage input to address line switch 110, Vt denotes the threshold voltage of MOS devices (e.g., address line switch 110 and switches 122, 128, and 130), Vcc denotes the power supply voltage applied to the MOS devices, X denotes a do not care state, and I source denotes the current applied to address line switch (i.e., it denotes DL current, which may also be referred to as the programming current). It is to be noted that, for example, with respect to DL in Table 1, X indicates that DL voltage may be GND to Vth.

In Table 1, columns DL, AL, TSL, BSL, RL, SV, and OV respectively indicate the values for the DL, AL, TSL, BSL, RL, SV, and OV signals. Also, in Table 1, rows Set Top, Reset Bottom, Reset Top, and Set Bottom indicate the values of the various signals for setting top PCM device 121, resetting bottom PCM device 127, resetting top PCM device 121, and setting bottom PCM device 127, respectively. In one embodiment, setting top PCM device 121 and resetting bottom PCM device 127 both occur in one clock cycle of the AL signal. Similarly, in one embodiment, resetting top PCM device 121 and setting bottom PCM device 127 both occur in one clock cycle of the AL signal. In another embodiment, the top and bottom devices may be programmed in multiple clock cycles of the AL signal. Furthermore, in Table 1, rows Sleep, Read, and Normal OP respectively indicate the values of the various signals during the sleep mode, read mode, and normal operation mode.

As can be seen in Table 1, during both the setting and resetting of top PCM device 121 and bottom PCM device 127, the RL, SV, and OV signals are all grounded. In other words, during programming of the PCM devices, the RL, SV, and OV signals are all grounded. As the RL signal is grounded during programming of the PCM devices, read line switch 130 is open. As a result, in one embodiment, half latch 140, cascade transistor 150 and pass gate 160 are electrically decoupled from voltage divider 120 during programming of the PCM devices. Similarly, as the SV signal is grounded during programming of the PCM devices, the terminal of PCM device 121 coupled to the SV signal is grounded. As can also be seen in FIG. 1, one terminal of PCM device 127 is also grounded. Similarly, as the OV signal is grounded during programming of the PCM devices, the terminal of half latch 140 and the terminal of cascade transistor 150 coupled to the OV signal are also grounded. This effectively places half latch 140 and cascade transistor 150 in an off state.

In one embodiment, during programming PCM device 121 to the SET state, the AL signal is greater than or equal to Vth+Vt, whereas during programming PCM device 127 to the RESET state, the AL signal is greater than or equal to V1+Vt, where V1 is greater than Vh and less than Vth. In another embodiment, during both programming PCM device 121 to the SET state and programming PCM device 127 to the RESET state, the AL signal is Vth+Vt. Such an embodiment, allows for a simpler AL signal, as is shown in FIGS. 3A and 3B. Also, in one embodiment, during programming PCM device 121 to the SET state, the TSL signal is greater than or equal to Vth+Vt, the DL voltage signal is greater than or equal to Vth, the DL current signal is limited to a setting current (Set I), and the BSL signal is grounded. In one embodiment, the setting current is controlled by the current source (not shown), which supplies the DL current signal and limits the maximum DL current signal used to place PCM device 121 in the SET state. During programming PCM device 127 to the RESET state, the TSL signal is grounded, the DL voltage signal is equal to V1, the DL current signal is at a reset current level (Reset I), and the BSL signal is greater than or equal to V1+Vt. In one embodiment, the reset current level is controlled with the gate bias on transistor 128 for PCM device 127. In one embodiment, the programming currents Set I and Reset I are less than approximately 1 mA, which allows for keeping the memory circuit size small. In another embodiment, during programming PCM device 127 to the RESET state, the BSL signal is equal to Vth+Vt. In such a case, the high binary value voltage for both TSL and BSL signals would be Vth+Vt.

In one embodiment, during programming PCM device 121 to the RESET state, the AL signal is greater than or equal to V1+Vt, whereas during programming PCM device 127 to the SET state, the AL signal is greater than or equal to Vth+Vt. In another embodiment, during both programming PCM device 121 to the RESET state and programming PCM device 127 to the SET state, the AL signal is Vth+Vt. Also, in one embodiment, during programming PCM device 121 to the RESET state, the TSL signals is greater than or equal to V1+Vt, the DL voltage signal is equal to V1, the DL current signal is at the reset current level (Reset I), and the BSL signal is grounded. In one embodiment, the reset current level is controlled with the gate bias on PCM device 121. In another embodiment, during programming PCM device 121 to the RESET state, the TSL signal is equal to Vth+Vt. Similarly, in one embodiment, during programming PCM device 127 to the SET state, the TSL signal is grounded, the DL voltage signal is greater than or equal to Vth, the DL current signal is limited to the setting current (Set I), and the BSL signal is greater than or equal to Vth+Vt. In one embodiment, the setting current is controlled by the current source, which supplies the DL current signal and limits the maximum DL current signal used to place PCM device 127 in the SET state.

In one embodiment, during the sleep mode, the DL signal is X, the AL signal is grounded, the TSL signal is equal to Vcc, the BSL signal is grounded, the RL signal is less than Vh+Vt, the SV signal is less than Vh, and the OV signal is less than Vh. It is to be noted that the sleep mode allows turning off bits that are not used. It is also to be noted that the sleep mode can be used to turn off unused logic elements (LEs), thus avoiding the memory read currents Iread of the memory circuits in the unused LEs and lowering the overall current Icc, where Icc represents the total static current consumed by the chip. In one embodiment, during sleep mode, top PCM device 121 is in the SET state, whereas bottom PCM device 127 is in the RESET state.

In one embodiment, during the read mode, the DL signal is X, the AL signal is grounded, the TSL signal is equal to Vcc, the BSL signal is equal to Vcc, the RL signal is less than Vh+Vt, the SV signal is less than Vh, and the OV signal is less than Vh. In one embodiment, during the read mode, to trip half latch 140, the SV signal is equal to the OV signal. It is to be noted that during the read operation, the OV signal drops to the level of the SV signal.

In one embodiment, during the normal operation mode, the DL signal is X, the AL signal is grounded, the TSL signal is equal to Vcc, the BSL signal is equal to Vcc, the RL signal is less than Vh+Vt, the SV signal is less than Vh, and the OV signal is equal to Vcc+Vod. In the normal operation mode, after the states of the PCM devices are read, the voltage at the terminals of half latch 140 and cascade transistor 150 coupled to the OV signal are raised from SV to OV since the OV signal drops to the level of the SV signal during the read operation. During normal operation, data is passed through pass gate 160.

As can be seen in Table 1, during the sleep, read and normal operation modes, the AL signal is grounded. As a result, address line switch 110 is off and voltage divider 120 is electrically decoupled from the DL voltage signal and the DL current signal.

During the read operation, if PCM device 121 is in SET state and PCM device 127 is in RESET state, then the voltage at terminal 125 is approximately equal to SV. It is to be noted that PCM device 121 in the SET state actively keeps up the voltage of voltage divider 120, i.e., the voltage at terminal 125, at approximately SV. As the voltage at terminal 125 is approximately equal to SV, a high binary value voltage is input, via read line switch 130, to half latch 140. In other words, a high binary value voltage is applied to terminal 135.

Half latch 140 inverts the voltage at terminal 135 and provides a low binary value voltage at terminal 155, which is coupled to the gate of pass gate 160. As noted above, in one embodiment, pass gate 160 is an NMOS transistor. Consequently, it is not switched on when the voltage at terminal 155 has a low binary value. As terminal 155 is also coupled to the gate of cascade transistor 150, which in one embodiment is a PMOS transistor, cascade transistor 150 is switched on, thus coupling OV signal to terminal 135. This reinforces the high binary value voltage at terminal 135.

On the other hand, if PCM device 121 is in RESET state and PCM device 127 is in SET state, then the voltage at terminal 125 is approximately equal to ground. It is to be noted that PCM device 127 in the SET state actively pulls down the voltage of voltage divider 120, i.e., the voltage at terminal 125. As the voltage at terminal 125 is approximately equal to ground, a low binary value voltage is input, via read line switch 130, to half latch 140. In other words, a low binary value voltage is applied to terminal 135. Half latch 140 inverts the voltage at terminal 135 and provides a high binary value voltage at terminal 155. As noted above, in one embodiment, pass gate 160 is an NMOS transistor. Consequently, it is switched on when the voltage at terminal 155 has a high binary value. As terminal 155 is also coupled to the gate of cascade transistor 150, cascade transistor 150 is not switched on, thus keeping terminal 135 electrically decoupled from the OV signal. Thus, in such a case, cascade transistor 150 does not increase the voltage at terminal 135.

In one embodiment, during the sleep, read and normal operation modes, the maximum SV signal is limited below the reset voltage and the minimum SV signal is limited by the sense amplifier noise margin. The reset voltage is the Vth when the PCM device is in the RESET state and Vh when the PCM device is in the SET state. The sense amplifier noise margin is the noise level the sense amplifier can withstand without losing its state. In other words, it is the minimum input voltage that the sense amplifier can latch. In one embodiment, the sense amplifier noise margin is evaluated and reduced so that the SV signal level can be minimized to the extent possible. As the SV signal affects Iread, reducing the SV signal level reduces Iread.

It is to be noted that memory circuit 100 is soft error resistant as it will recover from a soft error event. In case of a data error in half latch 120, the error can be fixed by lowering the OV signal to the SV signal (which as noted above is part of the normal read process) and reloading the data back into half latch 140 from voltage divider 120. In one embodiment, such correction may be done on a memory block column or memory block row basis. In another embodiment, it may be done on a bit basis. It is also to be noted that memory circuit 100 is Vmin tolerant (where Vmin is the minimum supply voltage required in a RAM to avoid data loss). As a result, memory circuit 100 is immune to data disturb. Additionally, memory circuit 100 does not suffer from read/write margin issues that exist in CRAM and RAM memory circuits.

FIG. 2 is a detailed diagram of another embodiment of a memory circuit of the present invention. In FIG. 2, memory circuit 200 includes address line switch 210, voltage divider 220, and pass gate 260. It is to be noted that memory circuit 200 may be defined to exclude pass gate 260. Alternatively, memory circuit 200 may be defined to exclude address line switch 210 and pass gate 260, in which case memory circuit 200 would be the same as voltage divider 220. It is also to be noted that a memory circuit, such as memory circuit 200, is at times referred to as a memory cell.

Voltage divider 220 includes PCM device 221, switches 222 and 228, and PCM device 227 coupled in series as shown in FIG. 2. PCM device 221 and switch 222 may herein be referred to as top PCM device 221 and top switch 222, respectively. Similarly, PCM device 227 and switch 228 may herein be referred to as bottom PCM device 227 and bottom switch 228, respectively.

In one embodiment, address line switch 210, switches 222 and 228, and pass gate 260 are all NMOS transistors.

In memory circuit 200, the AL signal controls the state of address line switch 210. The DL signal is the signal input into address line switch 210. It is to be noted that both a DL voltage signal and a DL current signal are input into address line switch 210. The TSL signal and BSL signal control the state of top switch 222 and bottom switch 228, respectively. SV is applied to one terminal of top PCM device 221.

With the exceptions noted below, memory circuit 200 is similar to memory circuit 100 and operates in a similar manner. Components and signals in memory circuit 200 that serve similar functions as their counterparts in memory circuit 100 have been designated with reference numbers that differ from those of their counterparts by one hundred. For example, address line switch 210 and voltage divider 220 in memory circuit 200 respectively correspond to address line switch 110 and voltage divider 120 in memory circuit 100. As memory circuit 200 is similar to memory circuit 100 and operates in a similar fashion, it will not be described in greater detail herein, except to note some of its differences relative to memory circuit 100.

The PCM devices in voltage divider 220 are similar to those of voltage divider 120 and are programmed in a similar manner. As can be seen in FIG. 2, memory circuit 200 does not include a read line switch that electrically decouples voltage divider 220 from pass gate 260 during programming of PCM devices 221 and 227. Instead, in memory circuit 200, during programming of PCM devices 221 and 227, terminals 261 and 262 (the drain and source terminals, respectively) of pass gate 260 are grounded. As a result, pass gate 260 is not turned on during programming of PCM devices 221 and 227.

As noted above, FIGS. 3A and 3B are exemplary timing diagrams for programming the PCM devices in the memory circuits of FIGS. 1 and 2. FIG. 3A is an exemplary timing diagram for programming top PCM device 221 to a SET state and bottom PCM device 227 to a RESET state. On the other hand, FIG. 3B is an exemplary timing diagram for programming top PCM device 221 to a RESET state and bottom PCM device 227 to a SET state. Table 2 below shows the values of relevant signals in FIG. 2 during programming of the PCM devices, the sleep mode, and the normal operation mode.

TABLE 2

| | DL | AL | TSL | BSL | SV |
|---|---|---|---|---|---|
| Set Top | ≧Vth I source | ≧Vth + Vt | ≧Vth + Vt | GND | GND |
| Reset Bottom | V1 | ≧V1 + Vt | GND | ≧V1 + Vt | GND |
| Reset Top | V1 | ≧V1 + Vt | ≧V1 + Vt | GND | GND |
| Set Bottom | ≧Vth I source | ≧Vth + Vt | GND | ≧Vth + Vt | GND |
| Sleep | X | GND | Vcc | GND | <Vh |
| Norm OP | X | GND | Vcc | Vcc | Vcc + Vod |

As can be seen from Tables 1 and 2, the values for the relevant signals in these tables are identical during programming. Also with the exception of the values for the SV signals, the values of the relevant signals in Tables 1 and 2 are identical during the sleep and normal operation modes. As memory circuit 200 does not include a read line switch, the RL signal is not applicable in memory circuit 200 and is not shown in Table 2. Similarly, memory circuit 200 does not include a separate read mode since there is no half latch or latch in memory circuit 200 into which data is read from voltage divider 220. Moreover, as memory circuit 200 does not include a cascade transistor and a half latch, the OV signal is not applicable in memory circuit 200 and is not shown in Table 2. Finally, during the sleep mode, the SV signal has the same values in Tables 1 and 2. However, during the normal operation mode, the SV signal in Table 2 is Vcc+Vod, which is different from the value it has in Table 1. It is to be noted that in Table 2, the SV signal has the same values as the OV signal has in Table 1.

As noted above, during the sleep mode, the relevant signals in Table 2 have the same values as their counterparts in Table 1. As these have been described in relation to Table 1, they will not be described herein in relation to Table 2. During the normal operation mode, with the exception of the SV signal, all the signals in Table 2 have the same values as in Table 1. In the normal operation mode, after the states of the PCM devices are read, they are passed through pass gate 260.

As can be seen from the above, during the sleep and normal operation modes, the AL signal is grounded. As a result, address line switch 210 is off and voltage divider 220 is electrically decoupled from the DL voltage signal and the DL current signal.

During the normal operation mode, if PCM device 221 is in the SET state and PCM device 227 is in the RESET state, then the voltage at terminal 225 is approximately equal to SV. As terminal 225 is directly coupled to the gate of pass gate 260, a high binary value voltage is applied to the gate of pass gate 260. As noted above, in one embodiment, pass gate 260 is an NMOS transistor. Also during the normal operation mode, terminals 261 and 262 (the drain and source terminals, respectively, of pass gate 260) are not grounded. Consequently, pass gate 260 is switched on when the voltage at terminal 225 has a high binary value. This electrically couples terminals 261 and 262.

On the other hand, if PCM device 221 is in the RESET state and PCM device 227 is in the SET state, then the voltage at terminal 225 is approximately equal to ground. As a result, a low binary value voltage is applied to the gate of pass gate 260. As noted above, in one embodiment, pass gate 260 is an NMOS transistor. Consequently, it is not switched on when the voltage at terminal 225 has a low binary value. As a result terminals 261 and 262 are not electrically coupled.

In one embodiment of memory circuit 200, the RESET state resistance is in the range of 1 MΩ to 1 GΩ and Vth is greater than OV for a given technology node. In one embodiment, Vcc is approximately 1.2 V, OV is approximately 1.55 V, and Vth is approximately 1.7 to 2 V. In another embodiment, Vcc is approximately 0.9 V, OV is approximately 1.2 V, and Vth is approximately 1.35 to 1.7 V.

In one embodiment where Vth is greater than OV and SV is equal to OV of the process node, for a 65 nanometer (nm) process node, Iread is approximately 1.5 nA per memory circuit for a RESET state resistance of approximately 1 GΩ, SV of approximately 1.55 V, and Iser of approximately 1.5 µA. In such a case, the total static current for $1 \times 10^6$ memory cells is approximately 1.5 mA. In one embodiment, memory circuit 200 does not require a fast read such as that required by flash memory.

In one embodiment, where SV is equal to OV, higher voltage transistors are used for address line switch 210, top switch 222, and bottom switch 228. Such higher voltage transistors are capable of passing a higher voltage signal to PCM devices 221 and 227 and to pass gate 260.

It is to be noted that memory circuits 100 and 200 are smaller in area than standard CRAM memory cells. It is further to be noted that since memory circuit 200 does not include a half latch circuit, a read line switch, or a cascade transistor, it has four less transistors than memory circuit 100. Additionally, memory circuit 200 does not include signals, such as the RL signal and the OV signal, which are present in memory circuit 100. As a result, memory circuit 200 involves less signal complexity than memory circuit 100. Moreover, memory circuit 200 is even less susceptible than memory circuit 100 to soft errors. In fact, memory circuit 200 is soft error immune as voltage divider 220 actively holds the voltage at terminal 225 coupled to the gate of pass gate 260.

It is to be noted that the PCM devices are immune to soft errors and are non-volatile. Similarly, memory circuits 100 and 200 are non-volatile. Additionally, the voltage dividers of memory circuits 100 and 200 limit leakage currents. As a result, a lower standby power is used in memory circuits 100 and 200. Furthermore, memory circuits 100 and 200 are scalable as they are respectively soft error resistant and immune. As such, memory circuits 100 and 200 can be used with smaller devices fabricated using smaller process nodes.

Figure 4:
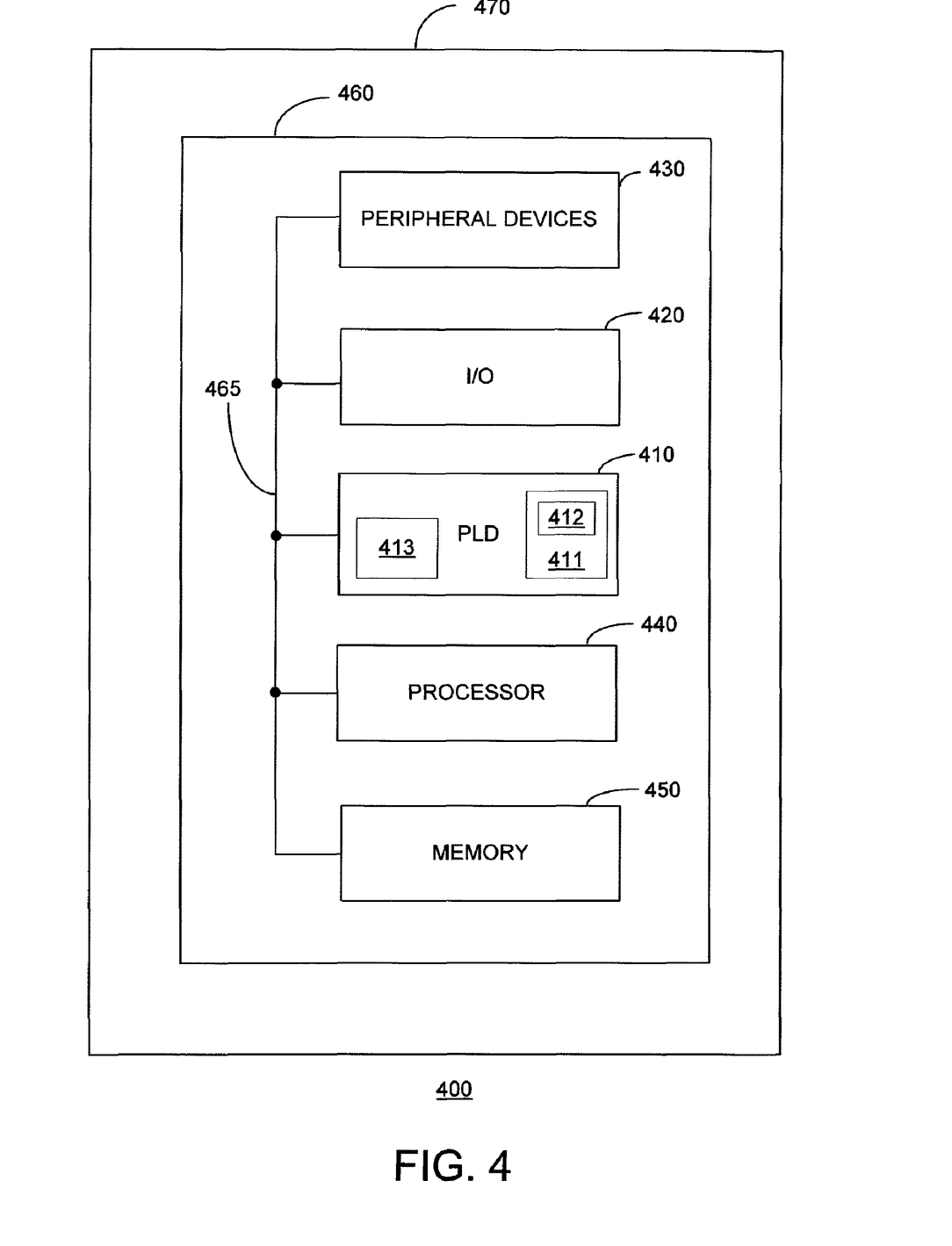
FIG. 4 illustrates an exemplary data processing system including an exemplary PLD in which memory circuits in accordance with embodiments of the present invention might be implemented.

FIG. 4 illustrates an exemplary data processing system including an exemplary PLD in which memory circuits in accordance with embodiments of the present invention might be implemented. FIG. 4 illustrates, by way of example, PLD 410 in data processing system 400. As one example, memory circuits of this invention may be implemented in a distributed memory within a logic block of PLD 410. Such a distributed memory may be used to configure a LUT and to connect global and local metal signal lines. In one embodiment, this distributed implementation would replace the traditional CRAM. In one embodiment, PLD 410 may include a plurality of distributed memories (but only one distributed memory is shown to avoid overcomplicating the drawing). Distributed memory 411 includes a plurality of memory circuits such as memory circuit 100 or 200 (but only one memory circuit, memory circuit 412, is shown to avoid overcomplicating the drawing). In one embodiment, memory circuit 412 and distributed memory 411 are on the same die/chip as PLD 410. In one embodiment, memory blocks, such as memory block 413 of PLD 410 may include PCM based memory cells. In one embodiment, PLD 410 may include a plurality of memory blocks such as memory block 413 (but only one such memory block is shown to avoid overcomplicating the drawing). In one embodiment, memory block 413 is on the same die/chip as PLD 410. In one embodiment, memory block 413 may be a small embedded array block (SEAB) or a medium embedded array block (MEAB). In another embodiment, with sufficiently fast set and reset times, memory block 413 may be a mega RAM (MRAM) block. In one embodiment, memory block 413 is a non-volatile memory block. Data processing system 400 may include one or more of the following components: processor 440, memory 450, input/output (I/O) circuitry 420, and peripheral devices 430. These components are coupled together by system bus 465 and are populated on circuit board 460 which is contained in end-user system 470. A data processing system such as system 400 may include a single end-user system such as end-user system 470 or may include a plurality of systems working together as a data processing system.

System 400 can be used in a wide variety of applications, such as computer networking, data networking, instrumentation, video processing, digital signal processing ("DSP"), or any other application where the advantage of using programmable or reprogrammable logic is desirable. PLD 410 can be used to perform a variety of different logic functions. For example, PLD 410 can be configured as a processor or controller that works in cooperation with processor 440 (or, in alternative embodiments, a PLD might itself act as the sole system processor). PLD 410 may also be used as an arbiter for arbitrating access to shared resources in system 400. In yet another example, PLD 410 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

In FIG. 4, embodiments of memory circuits of the present invention are discussed in the context of PLDs. It is to be noted, however, that embodiments of memory circuits of the present invention are not limited to being used in only PLDs. In other words, embodiments of memory circuits of the present invention may be used in other types of ICs.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A memory circuit comprising:
a voltage divider including:
 a first phase change memory (PCM) device; and
 a second PCM device coupled to the first PCM device;
a half latch coupled to the voltage divider; and
a cascade transistor coupled to the half latch and the voltage divider,
wherein the half latch is coupled to an overdrive voltage terminal, further wherein a first terminal of the cascade transistor is coupled to an output node of the half latch, a second terminal of the cascade transistor is coupled to an input node of the half latch, and a third terminal of the cascade transistor is directly coupled to the overdrive voltage terminal, wherein the first terminal is a gate terminal of the cascade transistor.

2. The memory circuit of claim 1, wherein the first PCM device is in a set resistance state and the second PCM device is in a reset resistance state.

3. The memory circuit of claim 2, wherein:
the voltage divider further includes:
 a first switch coupled to the first PCM device; and
 a second switch coupled to the first switch and the second PCM device.

4. The memory circuit of claim 3, wherein:
the half latch includes a complementary metal oxide semiconductor (CMOS) inverter including a n-channel metal oxide semiconductor (NMOS) transistor coupled in series to a p-channel metal oxide semiconductor (PMOS) transistor, where the input node of the half latch is coupled to a gate of the NMOS transistor and to a gate of the PMOS transistor;

the cascade transistor is a PMOS transistor, wherein the second terminal of the cascade transistor is a drain terminal of the cascade transistor and the third terminal of the cascade transistor is a source terminal of the cascade transistor;
the first switch is an NMOS transistor; and
the second switch is an NMOS transistor.

5. The memory circuit of claim 4 further comprising:
an address line switch coupled to the voltage divider; and
a read line switch coupled between the voltage divider and the half latch.

6. The memory circuit of claim 5 further comprising:
a pass gate transistor coupled to the output node of the half latch.

7. The memory circuit of claim 1, wherein the first PCM device and the second PCM device are pillar cell memory devices.

8. A distributed memory including the memory circuit of claim 1.

9. A programmable logic device including the memory circuit of claim 1.

10. A digital system comprising a programmable logic device including the memory circuit of claim 1.

11. A method of operating a memory circuit, the method comprising:
setting a first phase change memory (PCM) device in a first resistance state;
setting a second PCM device in a second resistance state;
wherein the first and second PCM devices are coupled in a voltage divider configuration;
using a half latch coupled to the voltage divider; and
using a cascade transistor coupled to the half latch and the voltage divider,
wherein the half latch is coupled to an overdrive voltage terminal, further wherein a first terminal of the cascade transistor is coupled to an output node of the half latch, a second terminal of the cascade transistor is coupled to an input node of the half latch, and a third terminal of the cascade transistor is directly coupled to the overdrive voltage terminal, wherein the first terminal of the cascade transistor is a gate terminal of the cascade transistor.

12. The method of claim 11, wherein the setting the first PCM device and the setting the second PCM device occur in one clock cycle of an address switch line coupled to the memory circuit.

13. The method of claim 11, wherein the first resistance state is a set resistance state and the second resistance state is a reset resistance state.

14. The method of claim 13 further comprising:
switching on a first switch coupled to the first PCM device; and
switching on a second switch coupled to the first switch and the second PCM device;
wherein a pass gate is coupled to a node coupling the first switch to the second switch.

15. The method of claim 14 further comprising:
switching on an address line switch to allow for setting the first and second PCM devices.

16. The method of claim 15, wherein:
setting the first PCM device includes applying a first pulse to the first PCM device; and
setting the second PCM device includes applying a second pulse to the second PCM device;
wherein the first pulse is longer in duration than the second pulse.

17. The method of claim 14 further comprising:
switching on a read line switch coupled at a first terminal to the node and at a second terminal to the half latch coupled to the pass gate;
applying a signal at the second terminal of the read line switch to the input terminal of the half latch; and
applying an output of the half latch to the pass gate.

18. The method of claim 17, wherein the
second terminal of the cascade transistor is coupled to the second terminal of the read line switch.

19. A memory circuit comprising:
a voltage divider including:
a first phase change memory (PCM) device, wherein the first PCM device is in a set resistance state;
a first switch coupled to the first PCM device;
a second switch coupled to the first switch; and
a second PCM device coupled to the second switch, wherein the second PCM device is in a reset resistance state;
a half latch coupled to the voltage divider; and
a cascade transistor coupled to the half latch and the voltage divider,
wherein the half latch is coupled to an overdrive voltage terminal, further wherein a first terminal of the cascade transistor is coupled to an output node of the half latch, a second terminal of the cascade transistor is coupled to an input node of the half latch, and a third terminal of the cascade transistor is directly coupled to the overdrive voltage terminal, wherein the first terminal is a gate terminal of the cascade transistor.

20. The memory circuit of claim 19, wherein:
the half latch includes a complementary metal oxide semiconductor (CMOS) inverter including a n-channel metal oxide semiconductor (NMOS) transistor coupled in series to a p-channel metal oxide semiconductor (PMOS) transistor, where the input node of the half latch is coupled to a gate of the NMOS transistor and to a gate of the PMOS transistor;
the cascade transistor is a PMOS transistor, wherein the second terminal of the cascade transistor is a drain terminal of the cascade transistor and the third terminal of the cascade transistor is a source terminal of the cascade transistor;
the first switch is an NMOS transistor; and
the second switch is an NMOS transistor.

21. The memory circuit of claim 20 further comprising:
an address line switch coupled to the voltage divider; and
a read line switch coupled between the voltage divider and the half latch;
wherein the address line switch is an NMOS transistor and the read line switch is an NMOS transistor.

22. The memory circuit of claim 19 further comprising:
a pass gate transistor coupled to the output node of the half latch.

23. A distributed memory including the memory circuit of claim 19.

24. A programmable logic device including the memory circuit of claim 19.

25. A digital system comprising a programmable logic device including the memory circuit of claim 19.

* * * * *